United States Patent
Franke

(10) Patent No.: US 6,867,972 B2
(45) Date of Patent: Mar. 15, 2005

(54) POWER COMPONENT ASSEMBLY FOR MECHATRONIC INTEGRATION OF POWER COMPONENTS

(75) Inventor: Ralf-Michael Franke, München (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/664,435

(22) Filed: Sep. 18, 2003

(65) Prior Publication Data

US 2004/0075985 A1 Apr. 22, 2004

(30) Foreign Application Priority Data

Oct. 22, 2002 (DE) .......................................... 102 49 205

(51) Int. Cl.⁷ ................................................ H05K 7/20
(52) U.S. Cl. ....................... 361/697; 361/704; 361/719; 257/712; 257/722; 174/252
(58) Field of Search ................................. 361/703, 704, 361/705, 707, 709, 712, 713, 718, 719, 760; 257/675, 706, 718, 719, 727; 174/16.3; 165/80.3, 185

(56) References Cited

U.S. PATENT DOCUMENTS

| | | | | |
|---|---|---|---|---|
| 6,055,158 A | * | 4/2000 | Pavlovic | 361/704 |
| 6,084,178 A | * | 7/2000 | Cromwell | 174/35 R |
| 6,185,100 B1 | * | 2/2001 | Bentz et al. | 361/704 |
| 6,188,576 B1 | * | 2/2001 | Ali et al. | 361/704 |
| 6,459,582 B1 | * | 10/2002 | Ali et al. | 361/704 |
| 6,697,263 B2 | * | 2/2004 | Szu | 361/816 |
| 2004/0042178 A1 | * | 3/2004 | Gektin et al. | 361/705 |

* cited by examiner

*Primary Examiner*—Boris Chervinsky
(74) *Attorney, Agent, or Firm*—Henry M. Feiereisen

(57) ABSTRACT

A power component assembly for mechatronic integration of power components is disclosed. The assembly includes a circuit board on which a plurality of bare power components is arranged. At least one cooling element is connected to a pressure-mounting frame that holds the power components in thermal contact with the cooling element(s). Heat generated by the power components is thereby dissipated by the cooling element(s).

8 Claims, 4 Drawing Sheets

POWER COMPONENT ASSEMBLY FOR MECHATRONIC INTEGRATION OF POWER COMPONENTS

CROSS-REFERENCES TO RELATED APPLICATIONS

This application claims the priority of German Patent Application, Serial No. 102 49 205.0, filed Oct. 22, 2002, pursuant to 35 U.S.C. 119(a)–(d), the disclosure of which is incorporated herein by reference.

BACKGROUND OF THE INVENTION

The present invention relates to a power component assembly for mechatronic integration of power components.

Electric drive systems are employed in many applications. The power ratings of such drives can range from microwatts (e.g., for wristwatches) to very high power ratings in the megawatt range (e.g., for locomotives, rolling mills, etc.). Such drive systems encompass a large range of applications, ranging from the simplest drive for toys to demanding position controls in machine tools.

An electric drive system includes at least one motor which receives electric energy from the power grid and converts the electric energy into rotational energy, and optionally a gear. Regulated or rotation-speed-adjustable drives are mostly used for larger drives or for more demanding applications, or if the maximum drive power is not always required. The electric motor in a regulated drive is operated via a power regulator, whereby a controller ensures that the desired process parameters are maintained. An electric power regulator is mostly implemented as a single unit that includes both the required power electronics and the associated signal processing. Such units are referred to, for example, as "converters" or "inverters". This term applies to the entire unit and not just to the power section.

The components used in the power electronics include diodes, thyristors, power transistors and MOSFETs, which are used in particular for high switching frequencies (of up to 1 MHz) and small voltages (of up to approximately 400V), as well as IGBTs (Insulated Gate Bipolar Transistors) for high power and moderate switching frequencies (3 kHz . . . 100 kHz). Modern IGBTs are available for high voltages (2 kV) and currents. IGBTs have found widespread applications in the drive technology. Modern inverters for operating asynchronous and synchronous machines in the power range from a few 100 W to the MW-range use almost exclusively IGBTs.

The power components are arranged in modules which can include individual switches and/or integrated switching assemblies The configuration and connection of the modules has to provide electrical isolation as well as a compact, preferably flat, installation size and advantageous thermal properties. At the same time, the cost for materials and processes has to be kept low while maintaining a high long-term reliability and a small failure rate. Moreover, a large power range should be covered with the smallest possible number of module configurations.

A manufacturer inserts the power components into a housing, and the terminals on the chips are connected with the external terminals of the housing. The dimensions of the housings and the assembly of the contact are standardized for the integrated circuits or chips used in low-power and communication devices, so that products from different manufacturers can be readily interchanged. No such standardized housing configurations exist for higher power electronic devices.

When a new module is developed, its functionality can be improved by optimally combining of the mechanical and electronic components through, e.g., mechatronic integration. The various parts of the applications have to cooperate for the integration to be successful by providing adequate pathways for the electrical current. Moreover, the power components should be arranged so that they are electrically isolated from each other and the heat of the power components is properly dissipated. In addition, the modules should be easy to install and operate reliably.

Power components from different manufacturers often differ with respect to their housing profile. The suitability of all components for mechatronic integration in the module must therefore be individually tested. The finally selected power component has in general a complex housing and may still not be optimized for a mechatronic integration in a realistic application.

In an actual system, the heat dissipation from the power components may still not be optimized because the origin of the heat loss cannot be spatially resolved. Frequently, the switching circuits in the power components have to be electrically insulated from each other, requiring a larger number of component and/or components with a more complex configuration. As a result, the entire system becomes less robust, has an increased installation volume and an inadequate thermal resistance (Rth).

In general, a distinct solution has to be found for each newly developed module in order to balance to requirements of the power component housing shape with the targeted application.

It would therefore be desirable and advantageous to provide an improved power component assembly, which obviates prior art shortcomings and specifically allows a mechatronic integration of different power components for an application.

SUMMARY OF THE INVENTION

According to one aspect of the present invention, a power component assembly for mechatronic integration of power components includes a circuit board, a plurality of bare power components arranged on the circuit board, at least one cooling element for dissipating heat generated by the power components, and a pressure-mounting frame connected with the at least one cooling element and holding the power components in heat-conductive contact with the cooling element.

An essential idea of the invention is to start with power components without a housing, which will be referred to as "bare" power components. It becomes then unnecessary to design a power component assembly for a large number of conventional housing shapes and sizes. Instead, the power component assembly can be directly optimized for the mechanical, electrical and thermal requirements of the actual application.

The power components can be flexibly arranged on a circuit board so as to optimize heat removal. The power component is connected to a cooling element for heat removal by a pressure contact, which eliminates a number of conventional connecting elements, such as a soldered baseplate. Elimination of these elements and the use of a pressure contact reduces the thermal resistance of the entire system and enhances the reliability of power modules.

According to an advantageous feature of the invention, the power component can be secured to the circuit board with a support strip that is connected to the power component and hence simultaneously forms a mechanical support for the power component. The support strip can be mechanically connected to the circuit board using the SMD (Surface-Mounted Device) technique. Contacts are formed by using at least two connecting strips which are each electrically connected to one of the contacts of the power component. The electrical connection with the circuit board is preferably also implemented by using the SMD technique.

Unlike conventional IMT (Insert Mount Technology) techniques, which require additional through-holes for attachment, SMD components are directly mounted on and soldered to the circuit board surface. SMD components are significantly less affected by temperature changes than components connected with wires; they are also more reliable and also more cost-effective and faster to process.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
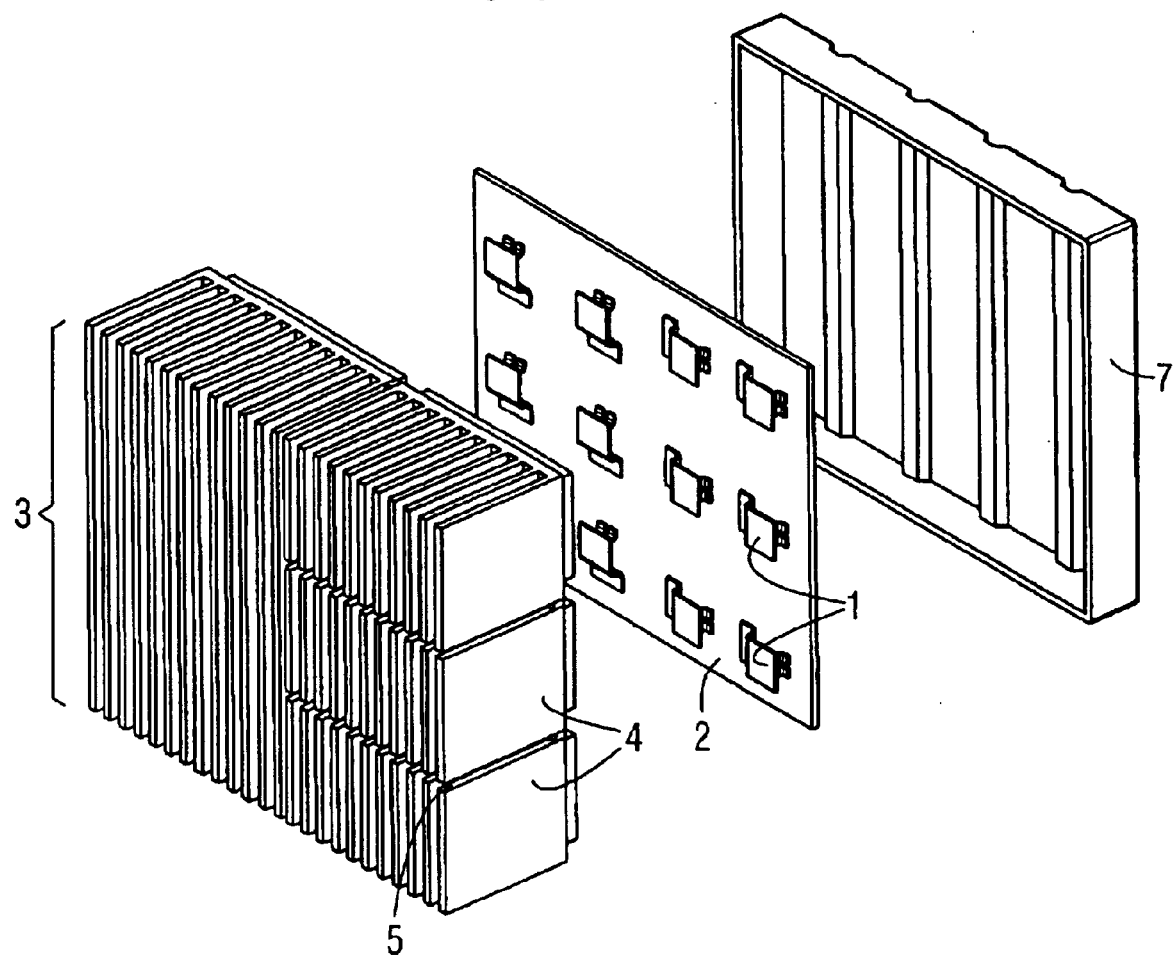
FIG. 1 shows an exploded view of a power component assembly according to the present invention.

Throughout all the Figures, same or corresponding elements are generally indicated by same reference numerals. These depicted embodiments are to be understood as illustrative of the invention and not as limiting in any way. It should also be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Figure 2:
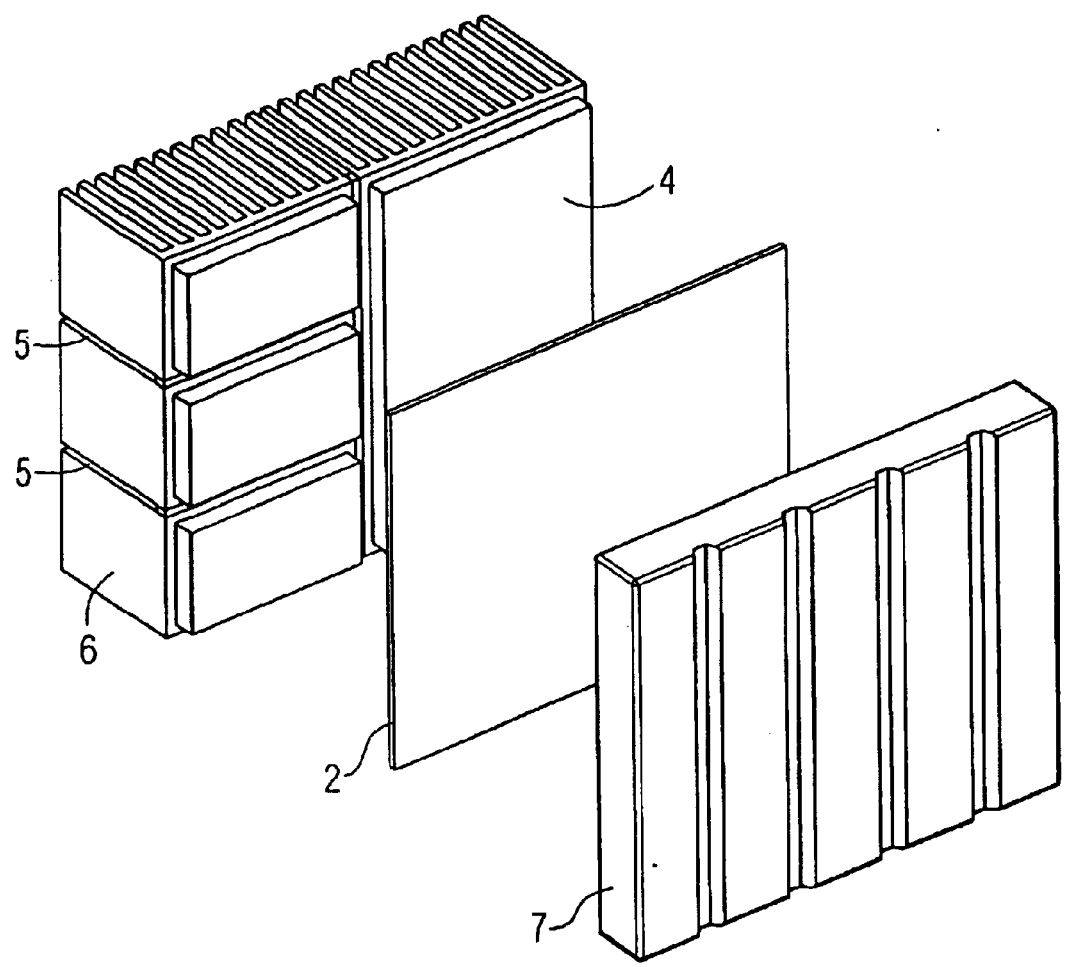
FIG. 2 shows an exploded view of the power component assembly of FIG. 1 from a different viewing angle.
Figure 3:
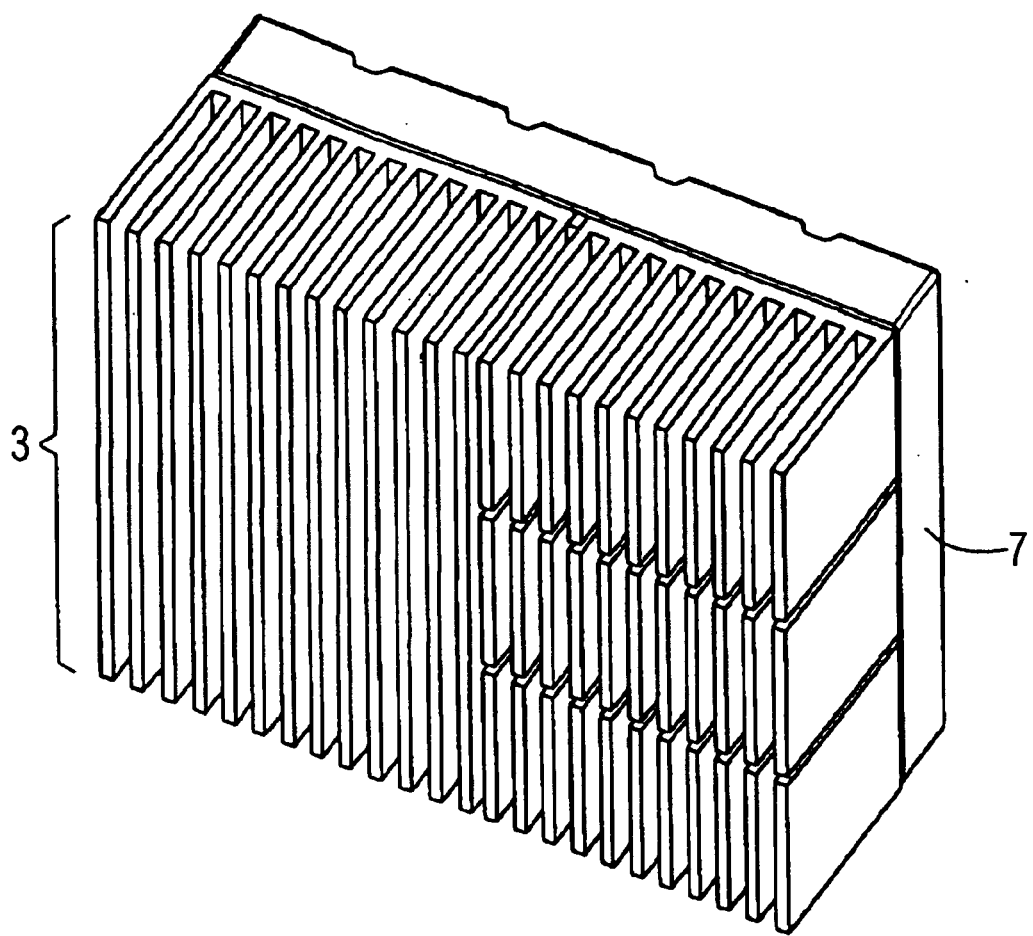
FIG. 3 shows the power component assembly of FIGS. 1 and 2 in an mounted state.

Turning now to the drawing, and in particular to FIGS. 1, 2 and 3, there is shown a power component assembly according to the invention. The power components are formed by bare IGBTs, i.e., IGBTs without a housing, which are integrated in twelve individual switching elements 1 and arranged on a circuit board 2. The circuit board 2 has conductor tracks (not shown) to conduct and distribute the electric current to, from and among the individual switching elements 1.

Each individual switching element 1 has three connecting strips for mechanical and electrical connection to the circuit board 2. As mentioned above, the connecting strips are applied to the circuit board using SMD technique.

The assembly further includes a cooling system 3 which includes a plurality of cooling elements 4. Since the individual switching elements 1 can be flexibly arranged, the electrical potentials in the application can be separated by electrically isolating the cooling elements 4. The cooling elements 4 can be separated from each other by gaps 5. As shown in FIG. 2, the cooling system can be formed by the cooling elements in conjunction with an insulating material 6 that maintains the gaps 5.

Figure 4:
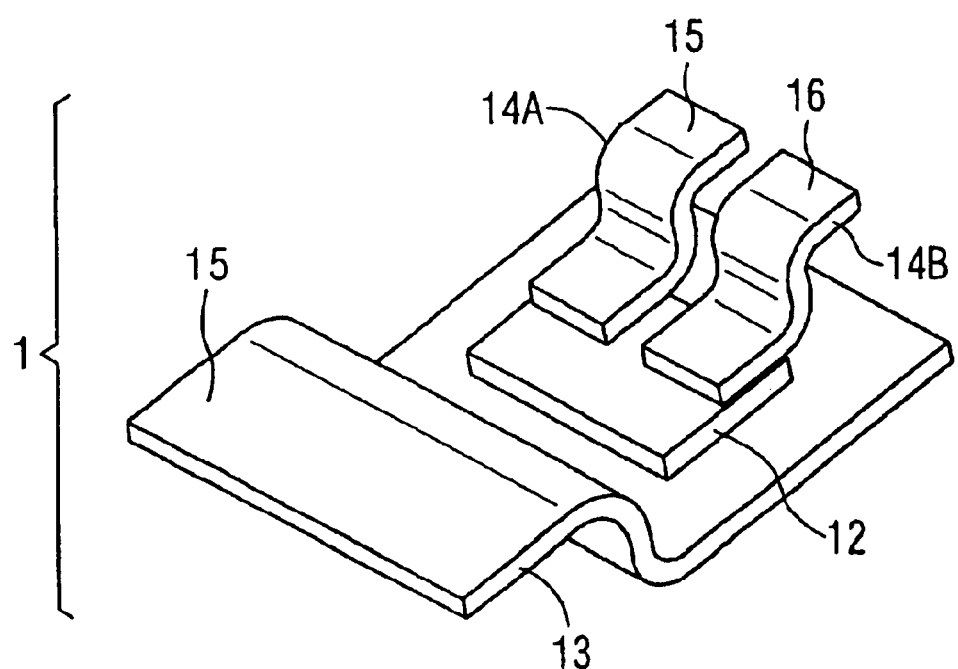
FIG. 4 shows a more detailed perspective view of a single switching element with a power component.

FIG. 4 shows a power component 12 without a housing, which is integrated in an individual switching element 1.

The individual switching element 1 includes, in addition to the power component 12, a support strip 13 and two connecting strips 14A, 14B. The exemplary power component 12 is here an IGBT and has a flat cuboid shape. The semiconductor component 12 is secured to the support strip 13 with an adhesive for mechanical support.

The terminals of the power component 12 are formed by contact surfaces (not shown) which cover a portion of the surface of the IGBT.

The two major terminals are located on opposite sides of the IGBT. The first major terminal of the IGBT is formed by the contact surface of the power component 12 which is secured to the support strip 13 with an electrically conductive adhesive. Accordingly, the support strip 13 is used both for mechanical support of the power component 12 as well as for making electrical contact with a terminal.

Electrical contact with the second major terminal is established by one of the connecting strips 14A. The second connecting strip 14B contacts the gate terminal of the IGBT 12.

The support strip 13 and the have an S-shaped profile. A respective surface area of the support strip 13 and of each connecting strip 14A, 14B is connected with the surface of the circuit board 2 using SMD technique. The support strip 13 and the connecting strip 14A each have a contact surface 15 for a major terminal, whereas the second connecting strip 14B has a contact surface 16 for the gate connection.

A pressure-mounting frame 7 is connected with the cooling system 3 by a locking connection, so that the power component assembly forms a single unit, as shown in FIG. 3. The circuit board 2 is located between the cooling system 3 and the pressure-mounting frame 7. The power components 1 arranged on the circuit board are in direct thermal contact with the cooling elements 4. The support strip 13 is formed so as to remove heat from the power component 12 to one of the cooling elements 4. The respective cooling element 4 makes two-dimensional contact with a side portion of the support strip 13 that faces away from the side supporting the power component 12. To optimize heat removal, the major dimensions of the support strip 13 are selected to be greater than the major dimensions of the power component 12.

In an alternative embodiment (not shown), the side of the circuit board 2 that supports the power components 1 faces away from the cooling system 3. In this case, the support strip 13 and the connecting strips 14A, 14B are formed so as to remove heat from the power component 12 via the contact surfaces 15, 16 to the circuit board 2. The circuit board 2 is in turn configured to remove heat from the contact surfaces 15, 16 to the cooling elements 4 by making two-dimensional contact with the cooling elements 4.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and their equivalents:

1. A power component assembly for mechatronic integration of power components, comprising a circuit board;

a plurality of bare power components arranged on the circuit board;

at least one cooling element for dissipating heat generated by the power components;

a pressure-mounting frame connected with the at least one cooling element and holding the power components in heat-conductive contact with the cooling element, a support strip that is mechanically connected with the circuit board and mechanically supports the power components; and at least two connecting strips for each power component, wherein each of the at least two connecting strips is electrically connected with a corresponding electrical contact of the power component and with the circuit board.

2. The power component assembly of claim 1, wherein the pressure-mounting frame and the at least one cooling element are in locking engagement with each other.

3. The power component assembly of claim 1, comprising a plurality of cooling elements which are galvanically isolated from each other.

4. The power component assembly of claim 1, wherein the support strip and the at least two connecting strips are formed by an SMD technique.

5. The power component assembly of claim 1, wherein the support strip or the connecting strips, or both, are configured to dissipate heat from the power components.

6. The power component assembly of claim 1, wherein the support strip or the connecting strips, or both, are connected with the power components with an adhesive or with solder.

7. The power component assembly of claim 1, wherein major dimensions of the support strip are equal to or greater than major dimensions of the power components.

8. The power component assembly of claim 1, wherein the support strip or the connecting strips, or both, have an S-shaped profile.

* * * * *